US009462381B2

(12) United States Patent
Krishnaswamy et al.

(10) Patent No.: US 9,462,381 B2
(45) Date of Patent: Oct. 4, 2016

(54) INTELLIGENT DYNAMICS PROCESSING

(71) Applicant: Apple Inc., Cupertino, CA (US)

(72) Inventors: Arvindh Krishnaswamy, San Jose, CA (US); Joseph M. Williams, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 46 days.

(21) Appl. No.: 14/495,819

(22) Filed: Sep. 24, 2014

(65) Prior Publication Data

US 2015/0350783 A1 Dec. 3, 2015

Related U.S. Application Data

(60) Provisional application No. 62/003,732, filed on May 28, 2014.

(51) Int. Cl.
*H03G 3/00* (2006.01)
*H04R 3/00* (2006.01)

(52) U.S. Cl.
CPC .......... *H04R 3/007* (2013.01); *H04R 2430/01* (2013.01); *H04R 2430/03* (2013.01)

(58) Field of Classification Search
CPC .......... H04R 3/007; H04R 3/04; H03G 7/00; H03G 7/005; H03G 7/04; H03G 7/06; H03G 7/08; H03G 11/00; H03G 3/00; H03G 9/06; H03G 9/10; H03G 9/14; H03G 9/16; H03G 9/18; H03G 9/20; H03G 11/006; H03G 11/008; H03G 11/04; H03G 11/08; H03G 2201/502; H03G 2201/504; H03G 2201/506; H03G 2201/508; H03G 2201/606; H03G 2201/702
USPC ............ 381/98–103, 104–110, 120, 121, 74, 381/82, 28, 320, 55, 61; 700/94; 339/126, 339/132; 375/229
See application file for complete search history.

(56) References Cited

U.S. PATENT DOCUMENTS

| | | | | |
|---|---|---|---|---|
| 4,457,014 A * | 6/1984 | Bloy | H03G 3/3005 | 381/106 |
| 4,882,762 A * | 11/1989 | Waldhauer | H03G 9/18 | 381/106 |
| 5,832,444 A | 11/1998 | Schmidt | | |
| 6,940,987 B2 | 9/2005 | Claesson | | |
| 8,626,516 B2 | 1/2014 | Zeng et al. | | |
| 2004/0178852 A1 * | 9/2004 | Neunaber | H03F 1/52 | 330/284 |
| 2011/0257982 A1 * | 10/2011 | Smithers | H03G 9/005 | 704/500 |
| 2012/0224720 A1 | 9/2012 | Naito | | |
| 2013/0336502 A1 * | 12/2013 | Jung | H03G 5/165 | 381/103 |

* cited by examiner

*Primary Examiner* — Leshui Zhang
(74) *Attorney, Agent, or Firm* — Blakely, Sokoloff, Taylor & Zafman LLP

(57) ABSTRACT

A multi-band audio compressor that may provide not only better and brighter sound, but also speaker protection. The multi-band audio compressor breaks an input audio signal into different frequency bands. For each band signal, a volume re-mapper translates a user preference volume level to a converted volume level based on a programmable volume curve for the band signal. For each frequency band, the band signal is processed by a gain stage and a compressor. Each gain stage applies a signal gain to the band signal based on the converted volume level. Each compressor compresses the output of the gain stage. After compression, the different frequency band signals are re-combined and the combined audio signal may then be passed to a power amplifier that is driving a speaker. Other embodiments are also described and claimed.

22 Claims, 9 Drawing Sheets

INTELLIGENT DYNAMICS PROCESSING

RELATED MATTERS

This application claims the benefit of the earlier filing date of provisional application No. 62/003,732, filed May 28, 2014, entitled "Dynamic Range Control with Speaker Protection".

FIELD

An embodiment of the invention is related to digital audio signal processing techniques, and particularly to techniques for dynamic range control.

BACKGROUND

Dynamic Range Control is an audio signal processing technique that narrows or "compresses" the swing or excursion of an audio signal, so that loud portions of the signal are made quieter while quiet portions may be made louder (if desired). DRC may also expand the signal swing or excursion. The dedicated electronic hardware unit or audio software used to apply compression is called a compressor. The DRC may be done to improve audibility in noisy environments. For example, increasing the volume to better hear the quiet portions in a noisy environment could make the loud portions too loud. Compression reduces the level of the loud portions, but not the quiet portions, so that volume can be raised to a point where the quiet portions are more audible without the loud portions sounding too loud. A compressor applies negative gain to an audio signal if its amplitude (in a given portion) exceeds a certain threshold to perform downward compression. Typically, an input/output ratio is defined that determines the amount of compression. For example, a 4:1 ratio means that an input signal overshooting a threshold by 4 dB will leave the compressor 1 dB above the threshold, i.e. a gain of −3 dB has been applied by the compressor to that portion of the signal. Also, in practice, a compressor exhibits a delay before its output level is actually reduced to the required level—this is referred to as the attack phase.

Somewhat similar to a compressor, a limiter also limits loud sounds. However, it does so in a much more abrupt manner, in effect exhibiting a much higher ratio and a much shorter attack phase. Limiting is typically used as a safety device rather than as a sound-sculpting tool.

SUMMARY

A multi-band audio compressor that may provide not only better and brighter sound, but also speaker protection. An embodiment of the multi-band audio compressor breaks an input audio signal into different frequency bands. For each band signal, a volume re-mapper translates a user preference volume level to a converted volume level based on a programmable volume curve for the band signal. For each frequency band, the band signal is processed by a gain stage and a compressor. Each gain stage applies a signal gain to the band signal based on the converted volume level. Each compressor compresses the output of the gain stage and can have different controls and configurations. After compression, the different frequency band signals are re-combined and the combined audio signal may then be passed to a power amplifier that is driving a speaker. By having a separately programmed volume curve for each frequency band, there may be less distortion introduced by the compressor at lower volumes.

In one embodiment, the multi-band audio compressor includes a feedback loop from a limiter (that is downstream of the compressor) to the gain stage and/or the compressor for each frequency band so that the gain stages and the compressors will not unnecessarily over-boost the audio signal, which may lead to distortion at the limiting stage. In one embodiment, the limiter generates or receives a speaker protection signal and reacts according to the speaker protection signal. In one embodiment, the speaker protection signal includes one or more of current, voltage, or thermal temperature measured at the speaker. In one embodiment, the limiter also forwards the speaker protection signal to the gain stages and/or the compressors. The gain stages and/or the compressors then reconfigure themselves accordingly by, for example, reducing a gain value that was previously determined based on the volume re-mapper's output, to reduce excessive amplification (i.e., to prevent over-boost) that may lead to distortion at the limiting or speaker protection stage. Therefore the volume re-mapper controlled gain stages and the compressors not only make music sound better/brighter, they can also perform hardware protection or characteristic restraints.

In one embodiment, the multi-band audio compressor includes a latency configuration module to reduce latency and improve vector calculations. The latency configuration module configures the internal processing size of the multi-band audio compressor to fit into the external block size of the input audio signal. In one embodiment, the latency configuration module determines an internal block size so that the external block size of the input audio signal is an integer multiple of the internal block size. The latency configuration module further divides a block of the input audio signal into several internal blocks based on the internal block size.

A method of audio processing that may provide better and brighter sound, but also speaker protection. An embodiment of the method divides an input audio signal into several different band signals. The method translates a user preference volume level to a converted volume level based on a programmable volume curve for each band signal. The method applies a signal gain to each band signal based on the converted volume level for the band signal. The method compresses each band signal. The method further combines the compressed band signals into a combined audio signal. The method limits the combined audio signal.

In one embodiment, the method sends a control signal from a module that limits the combined audio signal to modules that apply signal gains in order to reduce excessive amplification (i.e., to prevent over-boost) that may lead to distortion at the module that limits the combined audio signal. In one embodiment, the method sends a control signal from a module that limits the combined audio signal to modules that compress band signals in order to reduce excessive amplification (i.e., to prevent over-boost) that may lead to distortion at the module that limits the combined audio signal.

The method of one embodiment determining an internal block size so that a block size of the input audio signal is an integer multiple of the internal block size. The method further divides a block of the input audio signal into several internal blocks based on the internal block size. In one embodiment, the method determines a minimum latency based on an internal block size and a block size of the input audio signal. The method further inserts the minimum latency of silence at the start of each block of the input audio signal.

The above summary does not include an exhaustive list of all aspects of the invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The present invention is illustrated by way of example and not limitation in the figures of the accompanying drawings in which like references indicate similar elements.

DETAILED DESCRIPTION

A multi-band audio compressor that may provide not only better and brighter sound, but also speaker protection is described. In the following description, numerous specific details are set forth to provide thorough explanation of embodiments of the invention. It will be apparent, however, to one skilled in the art, that embodiments of the invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow are performed by processing logic that comprises hardware (e.g., circuitry, dedicated logic, etc.), software (such as is run on a general-purpose device or a dedicated machine), or a combination of both. Although the processes are described below in terms of some sequential operations, it should be appreciated that some of the operations described may be performed in different order. Moreover, some operations may be performed in parallel rather than sequentially.

Figure 1:
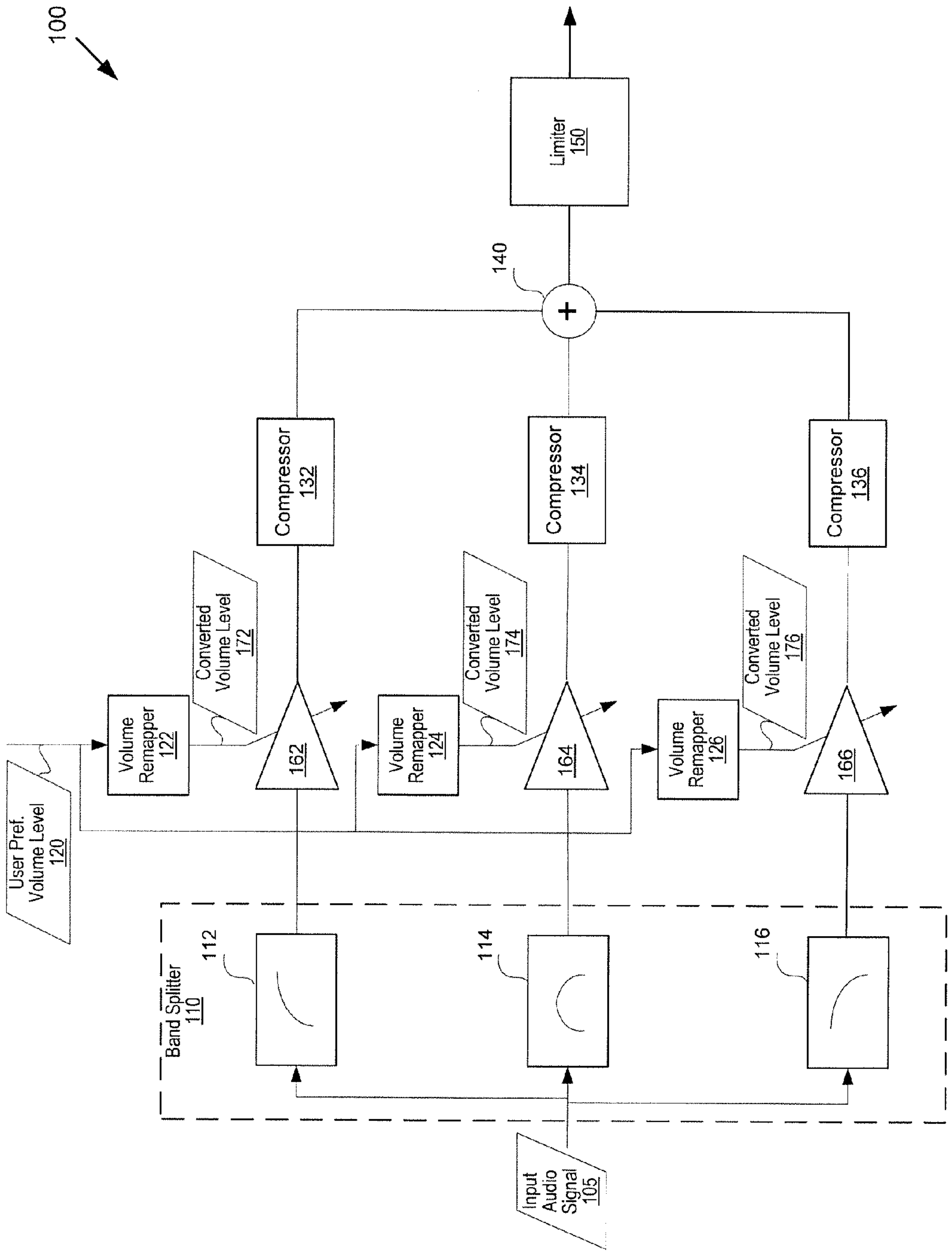
FIG. 1 illustrates a block diagram of a multi-band compressor of one embodiment.

FIG. 1 illustrates a block diagram of a multi-band compressor 100 of one embodiment. Multi-band compressors can act differently on different frequency bands. The advantage of multi-band compression over single-band compression is that unneeded audible gain changes or "pumping" in other frequency bands is not caused by changing signal levels in a single frequency band. In one embodiment, the multi-band compressor 100 is part of an audio processor. As illustrated in FIG. 1, the multi-band compressor 100 includes a band splitter 110, several volume re-mappers 122-126, several gain stages 162-166, several compressors 132-136, a band combiner 140, and a limiter 150.

The band splitter 110 receives the input audio signal 105 and splits the input audio signal through some number of band-pass filters or crossover filters into at least two essentially non-overlapping frequency bands, e.g. a low frequency band such as one whose entire signal content is below 1 kHz and a high frequency band such as one whose entire signal content is above 2 kHz, and a median frequency band such as whose entire signal content is between 1 kHz and 2 kHz. The frequency ranges or crossover frequencies may be adjustable. The number of frequency bands to split depends on the requirement for the multi-band compressor, lower order of frequency bands for lower complexity and higher order of frequency bands for tighter band control. As illustrated in FIG. 1, the band splitter 110 splits the input audio signal 105 into three frequency bands 112-116. Each of these bands (or band signals) is fed to a separate gain stage (from gain stages 162-166) and a separate compressor (from compressors 132-136).

Each of the volume re-mappers 122-124 receives a user preference volume level 120. The user preference volume level 120 is determined by the user and may be within a volume range (e.g., 0-16 or 0.0-1.0), where the floor of the volume range represents the minimum volume and the ceiling of the volume range represents the full volume. Each volume re-mapper translates the value of the user preference volume level 120 into a converted volume level 172, 174, and 176, respectively, based on a corresponding volume curve for the frequency band. The volume curve can have an arbitrary number of programmable points and the points between the programmable points are linearly interpolated. In one embodiment, the volume curve can define minimum and/or maximum gains for the frequency band. Different frequency bands can have different volume curves. Each volume curve can be individually configured and tuned. The volume curve will be further described in FIG. 2A below. In one embodiment, the converted volume levels are decibel (dB) values.

Each of the gain stages 162-166 receives a corresponding band signal from the band splitter 110 and applies a gain to the band signal based on a corresponding converted volume level, which is the output of a corresponding volume re-mapper for the band signal. By having a separate volume re-mapper with independent volume curve for each frequency band, the gains applied by each gain stage to its corresponding band signal is independent from each other and can be different. In one embodiment, because of this arrangement, there can be less compression subsequently and less distortion at lower volumes. For example, lower volume portion of the band signal is attenuated by the volume re-mapper and the gain stage so that there will be less compression at the compressor, thus less distortion.

Each of the compressors 132-136 receives the output of its corresponding gain stage and compresses the band signal according to its configuration and controls. In one embodiment, each of the compressors 132-136 is an RMS compressor, which applies an averaging function (e.g., RMS) on the input signal before its level is compared to the threshold. The RMS compressor allows a more relaxed compression that also more closely relates to human perception of loudness. In one embodiment, each compressor can have different length of RMS windows that share the attenuation calculations for a higher quality combined attenuation.

Different frequency bands can have different compressors. Each compressor can be individually configured and tuned. Each of the compressors 132-136 has a respective set of two or more programmable thresholds, e.g. noise gate threshold, downward compression threshold, upward compression threshold, etc. Each compressor can also have other controls and features, e.g. ratio, attack and release, soft and hard knees, etc. An example of compressor will be described in FIG. 2B below.

Because of the compression action of the compressors 132-136 on signal peaks, the acoustic distortion produced by the receiver, upon playing the combined voice signal, is less severe. In addition, the voice signal sounds louder due to the increased gain applied by the expansion action to signal troughs (which raises the RMS or average level of the combined signal), without undue acoustic distortion.

The band combiner 140 re-combines the compressed band signals received from the compressors 132-136 into a combined audio signal. The combined audio signal is sent to a hardware specific limiter 150. The limiter 150 limits the range of the combined audio signal to fit the capability of the speaker. The combined audio signal may then be passed to a power amplifier (not shown) that is driving a speaker.

The multi-band compressor 100 was described above for one embodiment of the invention. One of ordinary skill in the art will realize that in other embodiments, this module can be implemented differently. For instance, in one embodiment described above, certain modules are implemented as software modules for example to be executed by an application processor or a system-on-chip (SoC). However, in another embodiment, some or all of the modules might be implemented by hardware or programmable logic gates, which can be dedicated application specific hardware (e.g., an ASIC chip or component) or a general purpose chip (e.g., a microprocessor or FPGA).

Figure 2A:
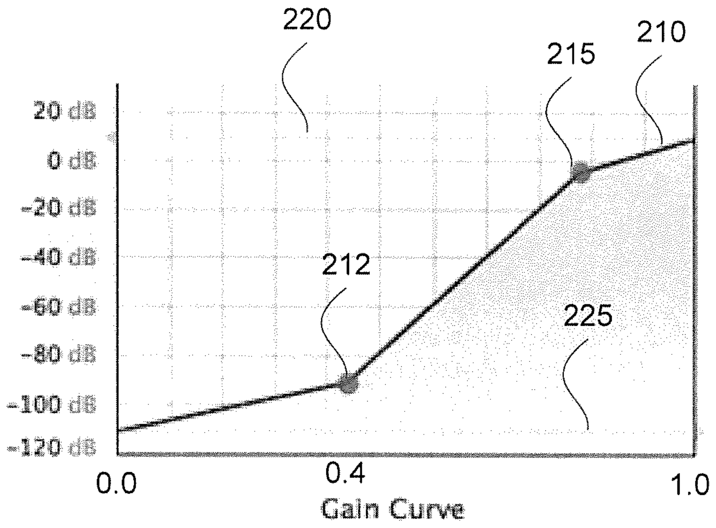
FIG. 2A illustrates an example of a volume curve.

FIG. 2A illustrates an example of a volume curve 210. As shown in FIG. 2A, there are two programmable points 212 and 215. There is also a maximum gain 220 at 10 dB and a minimum gain 225 at −110 dB. The volume curve 210 is created by linearly interpolating between the minimum gain 225 at range 0.0 and the programmable point 212, the programmable points 212 and 215, and the programmable point 215 and the maximum gain 220 at range 1.0. Each point on the volume curve 210 represents a mapping from a user preference volume level within the volume range 0.0-1.0 to a converted volume level (e.g., in dB). For example, the program point 212 represents a mapping between a user preference volume level 0.4 to −90 dB. There can be an arbitrary number of programmable points on a volume curve.

Figure 2B:
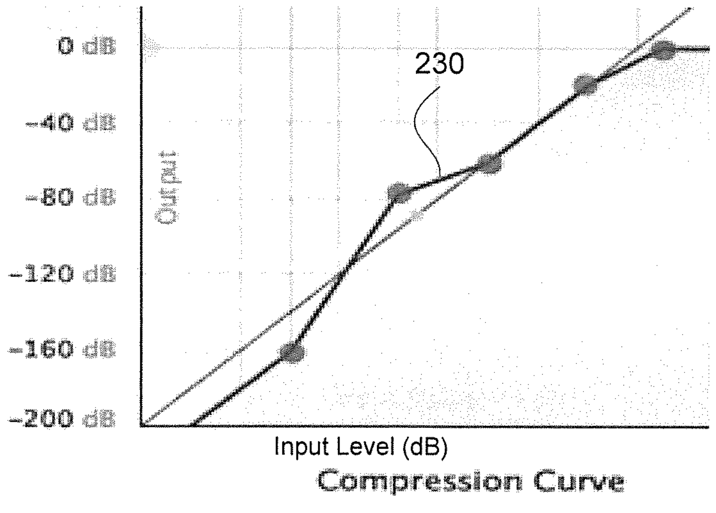
FIG. 2B illustrates an example of a compression curve for one embodiment of a compressor.

FIG. 2B illustrates an example of a compression curve 230 for one embodiment of a compressor. As shown in the figure, there can be many thresholds and controls to configure the shape of the compression curve 230. Therefore, the compressors for different band signals can be different.

Figure 3A:
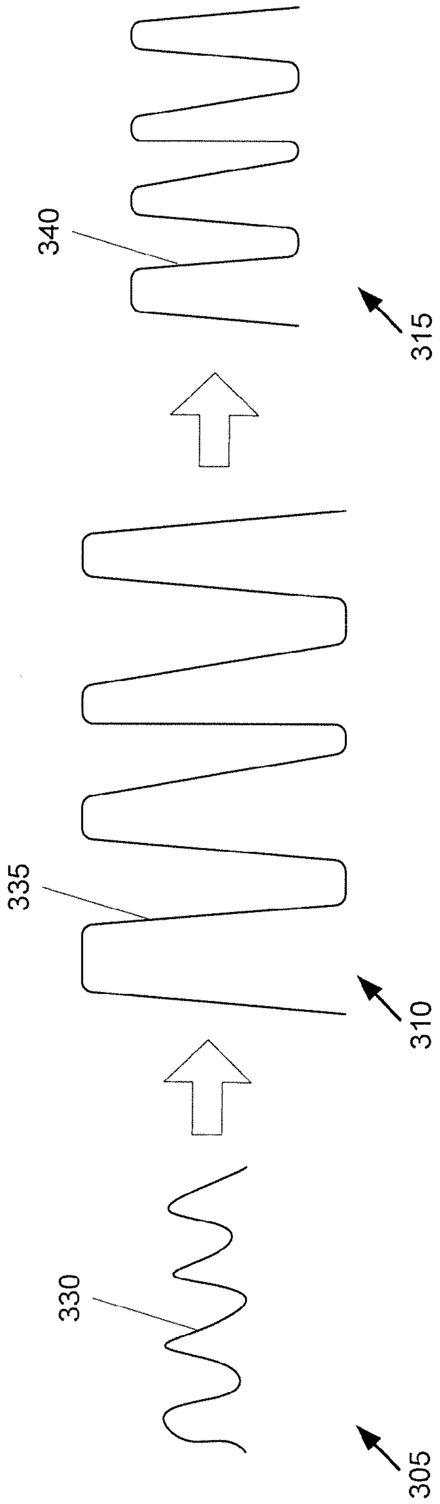
FIG. 3A illustrates waveforms of the audio signal at different stages of multi-band audio compression.

FIG. 3A illustrates waveforms of the audio signal at different stages of multi-band audio compression. In one embodiment, the multi-band audio compressor is the one described in FIG. 1 above. Specifically, FIG. 3A shows the changing shapes of audio signal waveform through three stages 305-315. At the first stage 305, waveform 330 of the input audio signal received at the multi-band audio compressor is displayed. At the second stage 310, waveform 335 is displayed. Waveform 335 represents a compressed audio signal after the input audio signal is processed by the gain stages and compressors described in FIG. 1 above. As shown in the figure, waveform 335 is distorted because of overboost by the gain stages and the compressors. At the third stage 315, waveform 335 is limited by a hardware specific limiter (e.g., limiter 150 described above in FIG. 1) to fit the capability of the speaker and transformed into waveform 340. Because waveform 340 is transformed from waveform 335, it inherits the distortions of waveform 335.

Figure 3B:
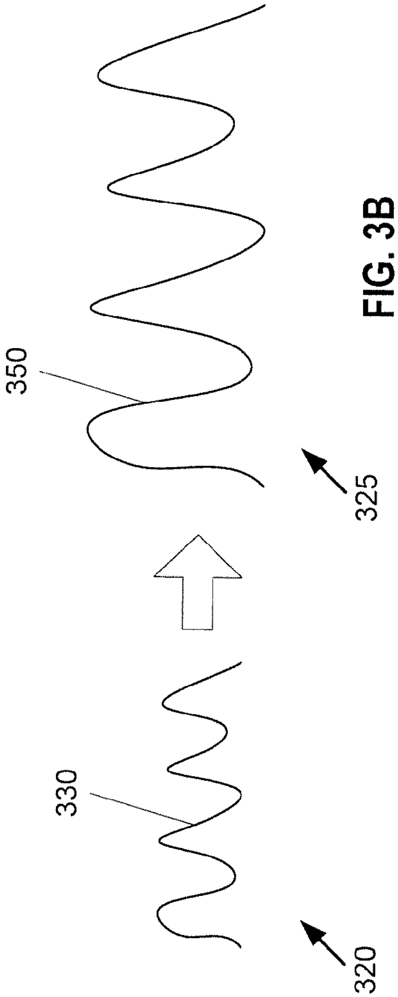
FIG. 3B illustrates the ideal waveform transformation through the multi-band audio compression.

FIG. 3B illustrates the ideal waveform transformation through the multi-band audio compression. Specifically, FIG. 3B shows the changing shapes of audio signal waveform through two stages 320 and 325. At the first stage 320, waveform 330 of the input audio signal is displayed. At the second stage 325, waveform 350 of the compressed audio signal is displayed. As shown in the figure, waveform 350 takes into consideration the capability of the speaker, thus is not over-boosted. As a result, waveform 350 is less distorted. Furthermore, because the compressor already takes into consideration the capability of the speaker, there is no need of additional limiting.

Figure 4:
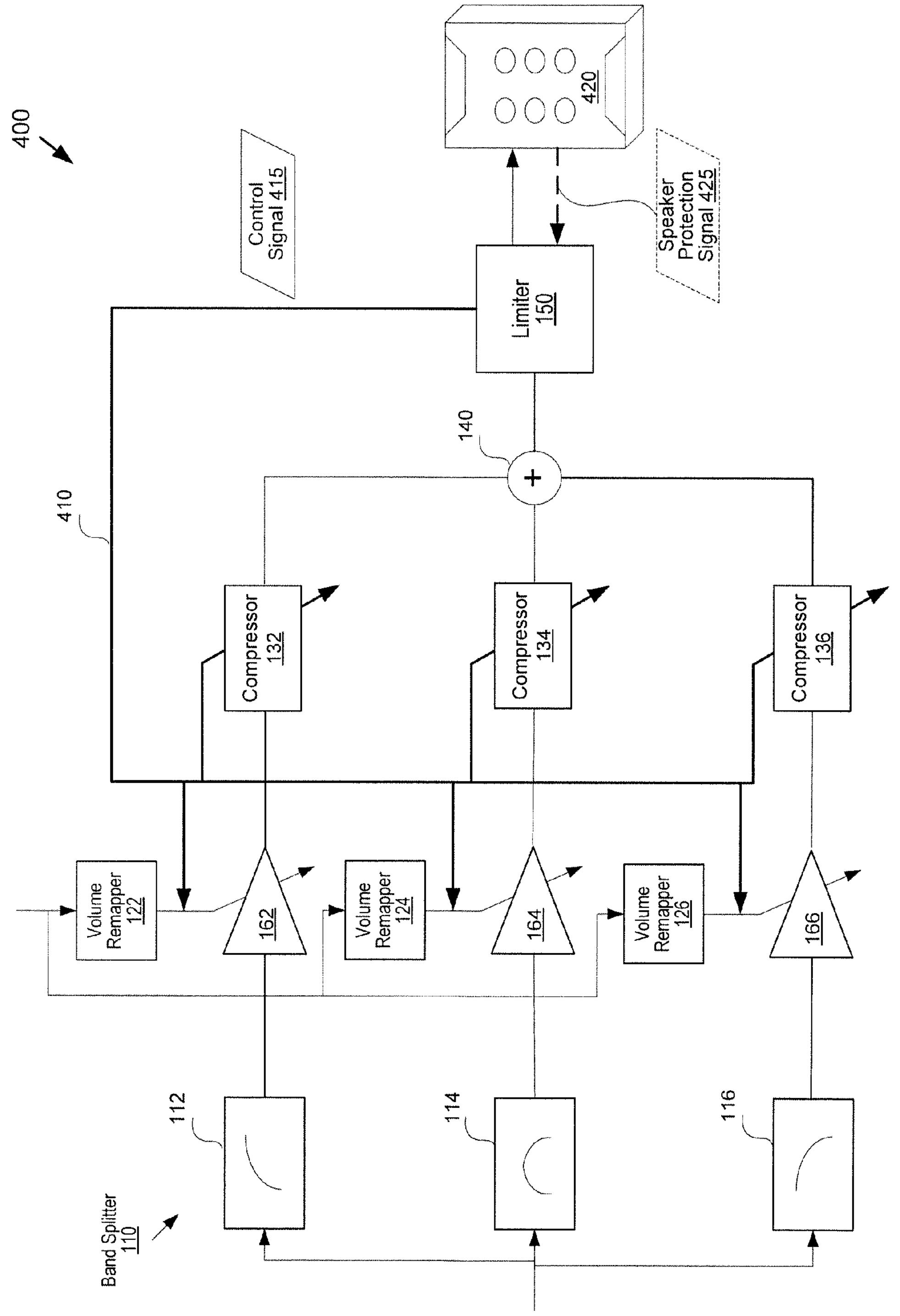
FIG. 4 illustrates a block diagram of a multi-band compressor of one embodiment that has a feedback loop.

FIG. 4 illustrates a block diagram of a multi-band compressor 400 of one embodiment that has a feedback loop. In one embodiment, the multi-band compressor 400 is part of an audio processor. As illustrated in FIG. 4, in addition to components of the multi-band compressor 100 described in FIG. 1 above, the multi-band compressor 400 includes a feedback loop 410 from the limiter 150 to the gain stages 162-166 and/or the compressors 132-136. The limiter 150 of the multi-band compressor 400 is connected to a speaker 420.

The limiter 150 sends control signal 415 to the gain stages 162-166 and/or compressors 132-136 through the feedback loop 410. The control signal 415 may include feedback signals to the gain stages 162-166 and/or feedback signals to the compressors 132-136. In one embodiment, the limiter 150 generates the control signal 415 based on its own operations. For example, when the limiter 150 detects that it is limiting the combined audio signal received from the band combiner 140 because the combined audio signal exceeds the physical range of the speaker 420, the limiter 150 sends control signal 415 to the gain stages 162-166 and/or compressors 132-136 to tell them to apply less signal gain to the band signals. This can help prevent the over-boost scenario described in FIG. 3A above. As a result, there will be less distortion in the output of the multi-band compressor 400 and less limiting applied by the limiter 150, as described in FIG. 3B above.

In one embodiment, the limiter 150 can generate or receive speaker protection signal 425. The speaker protection signal 425 could be speaker voltage and/or speaker current measured by sensing circuitry, or the speaker protection signal could be predicted or estimated using a speaker mathematical model and the input digital audio signal. The speaker protection signal 425 may include thermal temperature measured at the speaker 420. The limiter 150 analyzes the speaker protection signal 425 and reacts accordingly. For example and in one embodiment, when the speaker protection signal 425 indicates that the speaker 420 is overheating, the limiter 150 may further limit the combined audio signal it received, or it may send control signal 415 to the gain stages 162-166 and/or compressors 132-136 to ask them to apply less signal gain to the band signals. This prevents over-boost, introduces less distortion to the output of the multi-band compressor 400, and protects the speaker 420 at the same time.

Although FIG. 4 shows both the feedback signals to the gain stages and the feedback signals to the compressors in solid lines, it should be understood that both types of feedback signals are not needed in all instances. For example and in one embodiment, the feedback signals may be used to adjust the gain stages, but not the compressors. In another embodiment, the feedback signals may be used to adjust the compressors, but not the gain stages.

The multi-band compressor 400 was described above for one embodiment of the invention. One of ordinary skill in the art will realize that in other embodiments, this module can be implemented differently. For instance, in one embodiment described above, certain modules are implemented as software modules for example to be executed by an application processor or a system-on-chip (SoC). However, in another embodiment, some or all of the modules might be implemented by hardware or programmable logic gates, which can be dedicated application specific hardware (e.g., an ASIC chip or component) or a general purpose chip (e.g., a microprocessor or FPGA).

Figure 5:
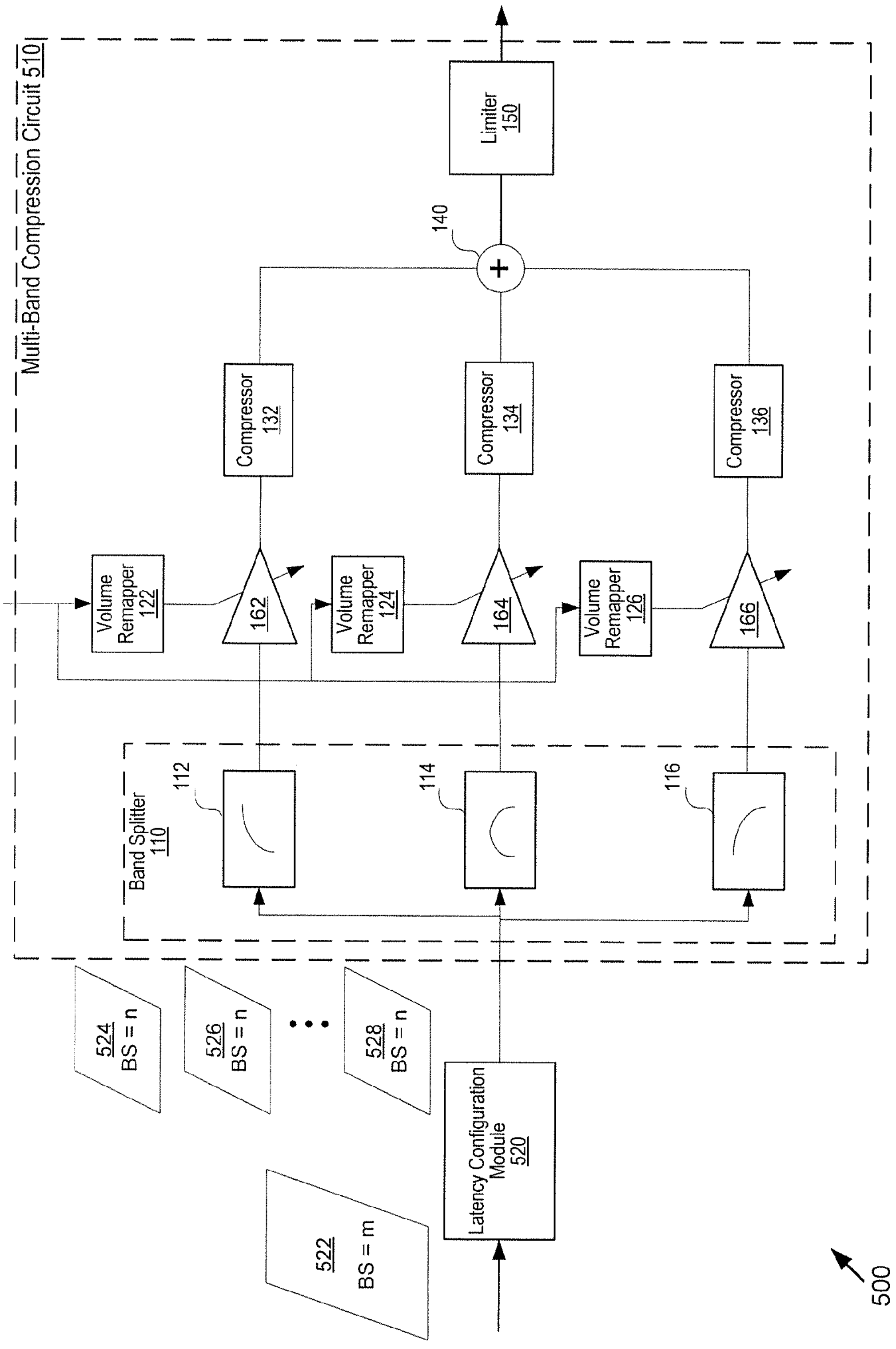
FIG. 5 illustrates a block diagram of a multi-band compressor of one embodiment with latency reduction.

It is important to reduce latency of audio and make audio playback more responsive, especially for conducting a telephone call. FIG. 5 illustrates a block diagram of a multi-band compressor 500 of one embodiment with latency reduction. As illustrated in FIG. 5, the latency configuration module 520 is a front end module that is placed in front of the multi-band compression circuit 510. In one embodiment, the multi-band compression circuit 510 is the multi-band compressors described in FIG. 1 or 4 above.

In one embodiment, the latency configuration module 520 configures or reconfigures the internal processing size of the multi-band compressor 500 to fit with the external block size of the input audio signal, thus reducing latency and improving vector calculations. In one embodiment, the latency configuration module 520 configures the size of internal blocks to a fixed size to avoid latency. In one embodiment, the latency configuration module 520 can be configured so that the multi-band compressor 500 has minimal latency for a purely variable input frame size.

In one embodiment, the latency configuration module 520 receives an external block 522 that has a block size of m, i.e. each external block has m samples. The external block 522 can be given in time domain or in frequency domain. The latency configuration module 520 can determine an internal block size n (i.e., each internal block has n samples), where m is an integer multiple of n. In one embodiment, the time period of each internal block sample equals to the tuning time constant of the compressors 132-136. In one embodiment, the tuning time constant of the compressors is the amount of time it will take for the gain to change a set amount of dB (e.g., 10 dB). Thus the internal block size n is the time period of an internal block divided by the turning time constant of the compressors. In one embodiment, if m is not an integer multiple of n, the latency configuration module 520 adjusts the time period of the internal block sample based on the turning time constant of the compressors so that m becomes an integer multiple of n. The latency configuration module 520 then divides the external block 522 into several internal blocks 524-528, each of which has a block size of n. The internal blocks are then processed by the gain states 162-166 and compressors 132-136 of the multi-band compression circuit 510.

For example and in one embodiment, the external block 522 has a block size of 128, which means it has 128 samples. Then the internal block size can be 32, which means each internal block has 32 samples. In one embodiment, if the tuning time constant of the compressors 132-136 is 2.5 ms, which causes the internal block size to be 33. The latency configuration module 520 can adjust the time period of the internal block sample, e.g. to 2.52 ms, so that the internal block size becomes 32. This makes the external block size (128) an integer multiple of the internal block size (32) by making ignorable adjustment to the turning time constant.

The latency configuration module 520 then divides the external block 522 into 4 internal blocks, each of which has 32 samples. Because 128 is an integer multiple of 32, there are no leftover samples, thus no additional buffering is needed and delay is reduced. The internal blocks are then processed by the gain stages 162-166 and compressors 132-136 of the multi-band compression circuit 510. In one embodiment, in order to make sure that the external block size is an integer multiple of the internal block size, the latency configuration module 520 adjusts the length of each sample in the internal block. By doing so, the latency configuration module 520 introduces more efficient operations, less latency/buffering within the multi-band compression circuit 510, and preserves audio quality.

In one embodiment, the time period of each of the internal blocks 524-528 is a pre-defined period of time that cannot be changed. The latency configuration module 520 can determine a minimum latency for the multi-band compressor 500. In one embodiment, the latency configuration module 520 adds the minimum latency of silence to the start of the external block 522 to enable optimal latency at the multi-band compressor 500. For example and in one embodiment, the time period of each of the internal blocks 524-528 needs to be maintained at the pre-defined 12 ms while the time period of the external block 522 is 16 ms. The latency configuration module 520 can determine that a minimum latency of 8 ms is needed for the multi-band compressor 500. In one embodiment, the latency configuration module 520 adds 8 ms of silence to the start of the external block 522 to be able to optimally process at 12 ms internally with an external block of 16 ms.

The multi-band compressor 500 was described above for one embodiment of the invention. One of ordinary skill in the art will realize that in other embodiments, this module can be implemented differently. For instance, in one embodiment described above, certain modules are implemented as software modules for example to be executed by an application processor or a system-on-chip (SoC). However, in another embodiment, some or all of the modules might be implemented by hardware or programmable logic gates, which can be dedicated application specific hardware (e.g., an ASIC chip or component) or a general purpose chip (e.g., a microprocessor or FPGA).

Figure 6:
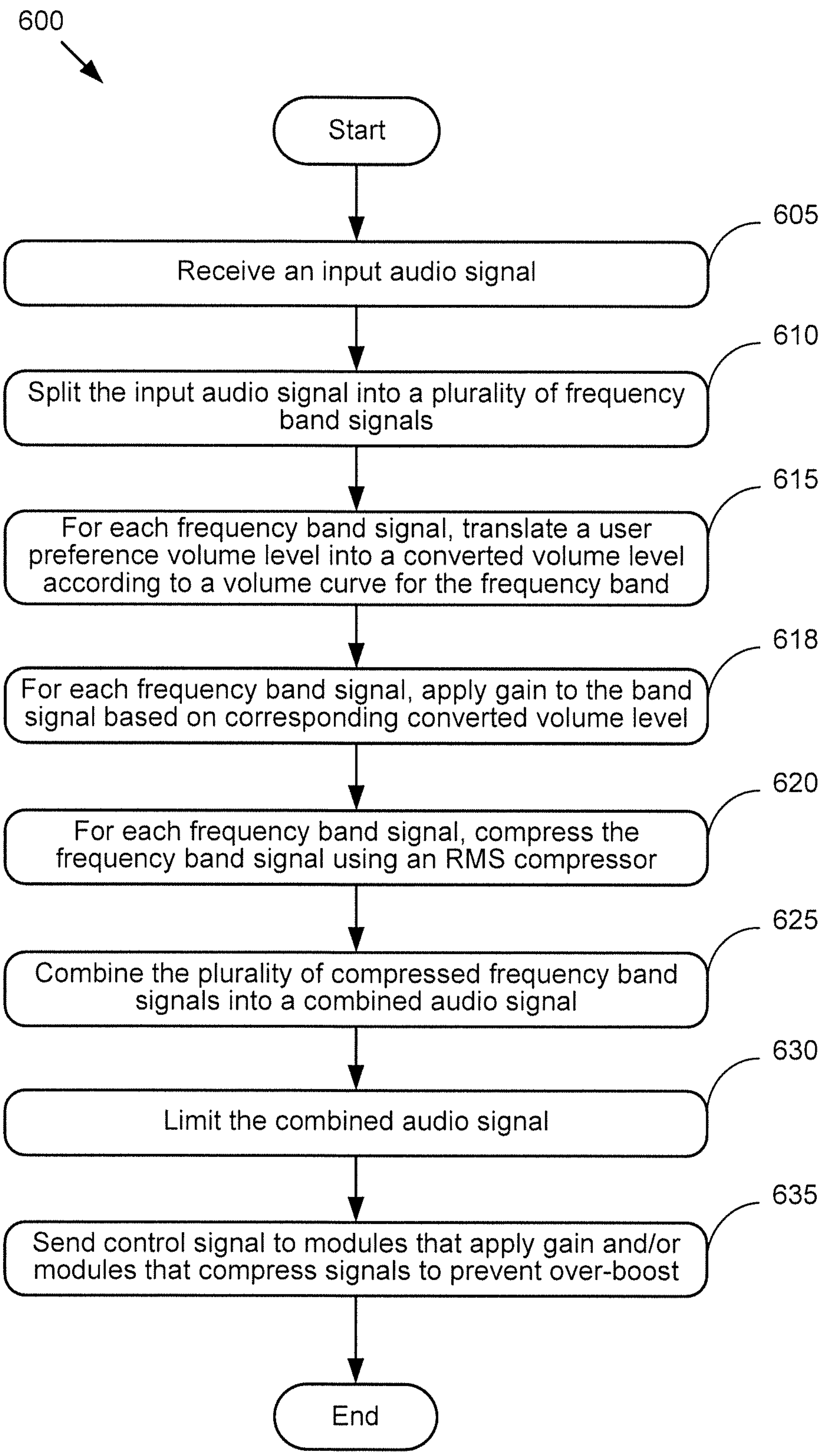
FIG. 6 illustrates a flowchart of operations performed in a multi-band audio compressor.

FIG. 6 illustrates a flowchart of operations performed in a multi-band audio compressor, referred to as process 600.

In one embodiment, the multi-band audio compressor (e.g., the multi-band compressor 100 of FIG. 1, the multi-band compressor 400 of FIG. 4, or the multi-band compressor 500 of FIG. 5) executes process 600 when an input audio signal is received. As illustrated in FIG. 6, process 600 begins by receiving (at block 605) an input audio signal.

At block 610, process 600 splits the input audio signal into a plurality of frequency band signals. In one embodiment, the band splitter 110 described in FIG. 1 above performs this operation.

At block 615, for each frequency band signal, process 600 translates a user preference volume level into a converted volume level according to a programmable volume curve for the frequency band. In one embodiment, the user preference volume level can be a value within a volume range values, for example, 0.0-1.0 (0.0 represents the minimum volume and 1.0 represents the full volume). The converted volume level can be a dB value. In one embodiment, each of the volume re-mappers 122-126 described in FIG. 1 above performs the operations of block 618.

For each frequency band signal, process 600 applies (at block 618) signal gain to the band signal based on a corresponding converted volume level for the band signal. In one embodiment, each of the gain stages 162-166 described in FIG. 1 above performs the operations of block 615.

At block 620, for each frequency band signal, process 600 compresses the frequency band signal using an RMS compressor. In one embodiment, the RMS compressors are the compressors 132-136 described in FIG. 1 above. In one embodiment, the RMS compressor compresses audio signal outputted by a corresponding gain stage for the band signal.

Process 600 combines (at block 625) the plurality of compressed frequency band signals into a combined audio signal. In one embodiment, this operation is performed by the band combiner 140 described in FIG. 1 above.

At block 630, process 600 limits the combined audio signal. In one embodiment, the limiter 150 described in FIG. 1 above performs this function.

Process 600 sends (at block 635) a control signal to modules that apply signal gains (e.g., the gain stages) and/or modules that compress band signals (e.g., the RMS compressors) to prevent unnecessary over-boost. In one embodiment, the control signal is sent by the limiter 150 through the feedback loop 410 to the gain stages 162-166 and/or compressors 132-136, as described in FIG. 4 above.

One of ordinary skill in the art will recognize that process 600 is a conceptual representation of the operations executed by the multi-band audio compressor. The specific operations of process 600 may not be performed in the exact order shown and described. The specific operations may not be performed in one continuous series of operations, and different specific operations may be performed in different embodiments. For example and in one embodiment, the operations in block 635 may not be performed. Furthermore, process 600 could be implemented using several sub-processes, or as part of a larger macro process.

Figure 7:
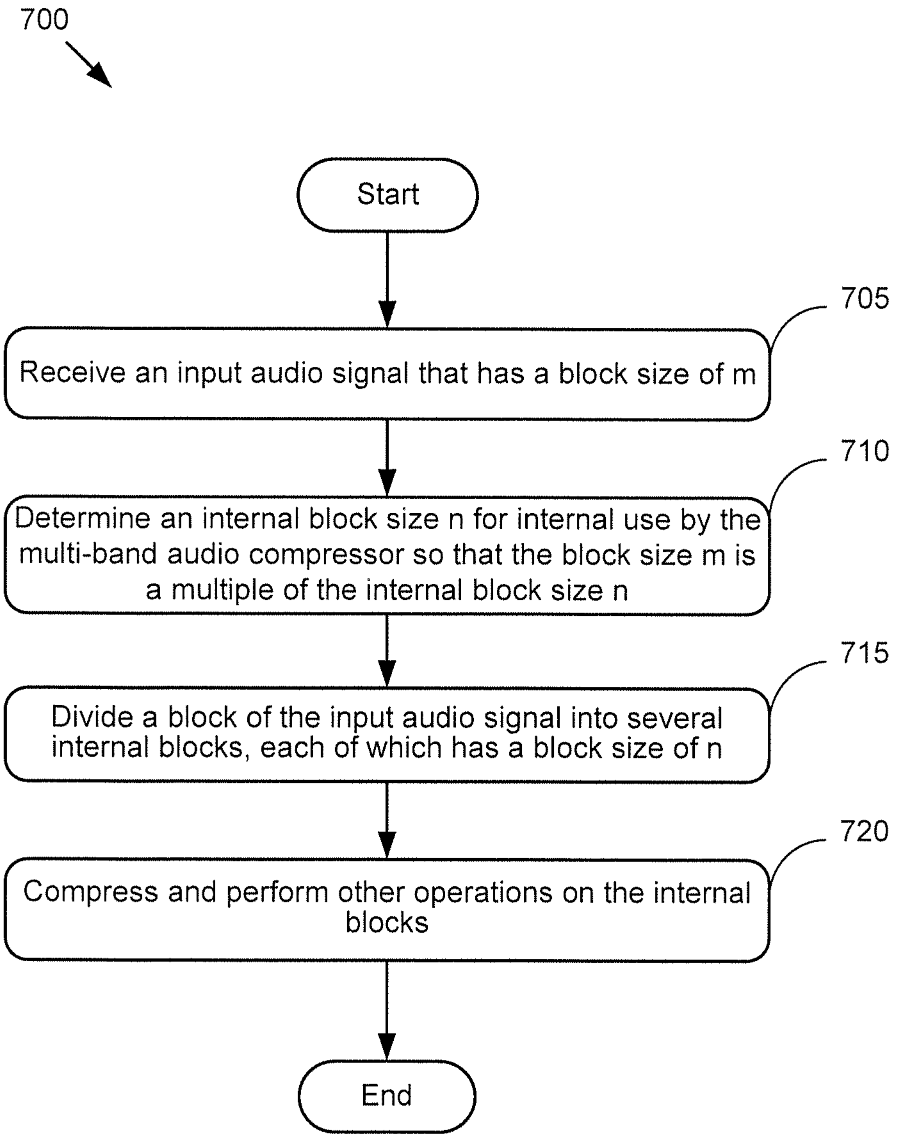
FIG. 7 illustrates a flowchart of one embodiment of operations performed in a multi-band audio compressor to reduce latency.

FIG. 7 illustrates a flowchart of one embodiment of operations performed in a multi-band audio compressor to reduce latency, referred to as process 700. In one embodiment, the multi-band audio compressor (e.g., multi-band compressor 500 of FIG. 5) executes process 700 when an input audio signal is received. In one embodiment, the operations of process 700 are performed before the operations in blocks 610-635 of process 600 described in FIG. 6 above. As illustrated in FIG. 7, process 700 begins by receiving (at block 705) an input audio signal that has a block size of m, i.e. each block has m samples.

At block 710, process 700 determines an internal block size n (i.e., each internal block has n samples) for internal use by the multi-band audio compressor so that the block size m is an integer multiple of the internal block size n. In one embodiment, the time period of each internal block sample equals to the tuning time constant of the compressors (e.g., compressors 132-136 described in FIG. 5 above). Thus the internal block size n is the time period of an internal block divided by the turning time constant of the compressors. In one embodiment, if m is not an integer multiple of n, process 700 can adjust the time period of each internal block sample based on the turning time constant of the compressors so that m becomes an integer multiple of n, as described in FIG. 5 above.

At block 715, process 700 divides a block of the input audio signal into several internal blocks, each of which has a block size of n. In one embodiment, the operations in blocks 710 and 715 are performed by the latency configuration module 520 described in FIG. 5 above. At block 720, process 700 compresses and perform other operations on the internal blocks. In one embodiment, those operations are the operations described in blocks 610-635 of FIG. 6 above.

One of ordinary skill in the art will recognize that process 700 is a conceptual representation of the operations executed by the multi-band audio compressor for latency reduction. The specific operations of process 700 may not be performed in the exact order shown and described. The specific operations may not be performed in one continuous series of operations, and different specific operations may be performed in different embodiments. Furthermore, process 700 could be implemented using several sub-processes, or as part of a larger macro process.

Figure 8:
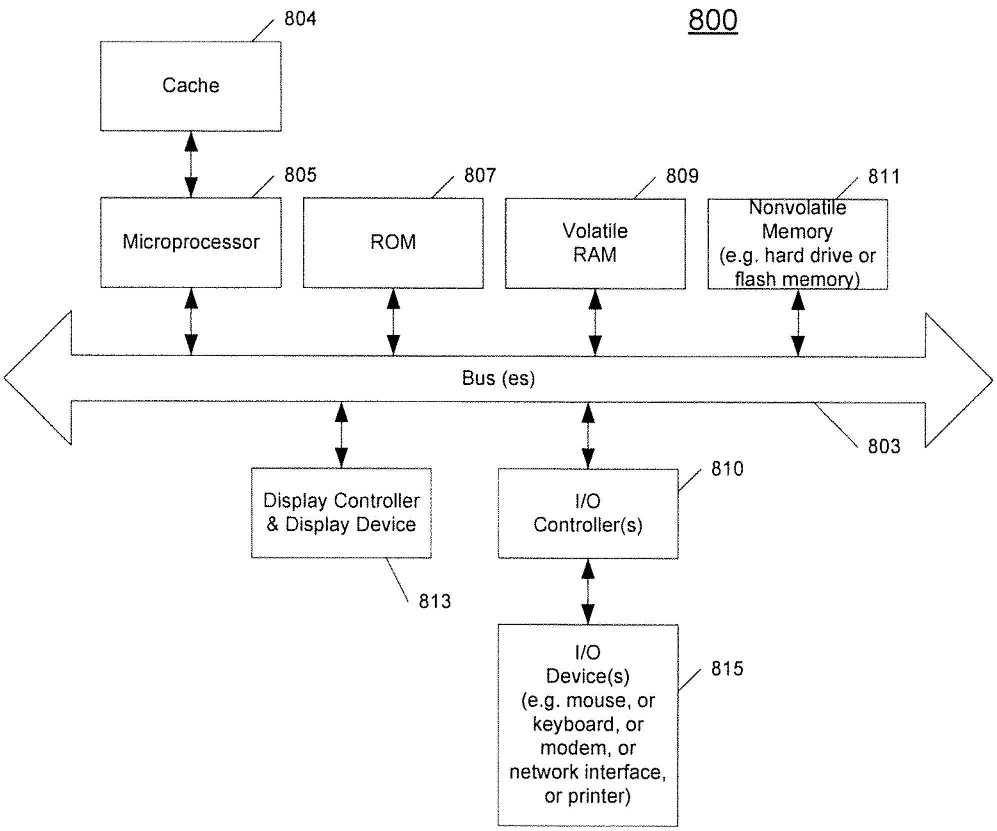
FIG. 8 illustrates one example of a data processing system, which may be used with one embodiment of the invention.

FIG. 8 shows one example of a data processing system 800, which may be used with one embodiment of the invention. For example, the system 800 may be implemented including a device 100 as shown in FIG. 1. Note that while FIG. 8 illustrates various components of a device, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 8, the device 800, which is a form of a data processing system, includes a bus 803 which is coupled to a microprocessor(s) 805 and a ROM (Read Only Memory) 807 and volatile RAM 809 and a non-volatile memory 811. The microprocessor 805 may retrieve the instructions from the memories 807, 809, 811 and execute the instructions to perform operations described above. The bus 803 interconnects these various components together and also interconnects these components 805, 807, 809, and 811 to a display controller and display device 813 and to peripheral devices such as input/output (I/O) devices 815 which may be mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 8 shows that the non-volatile memory 811 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Figure 9:
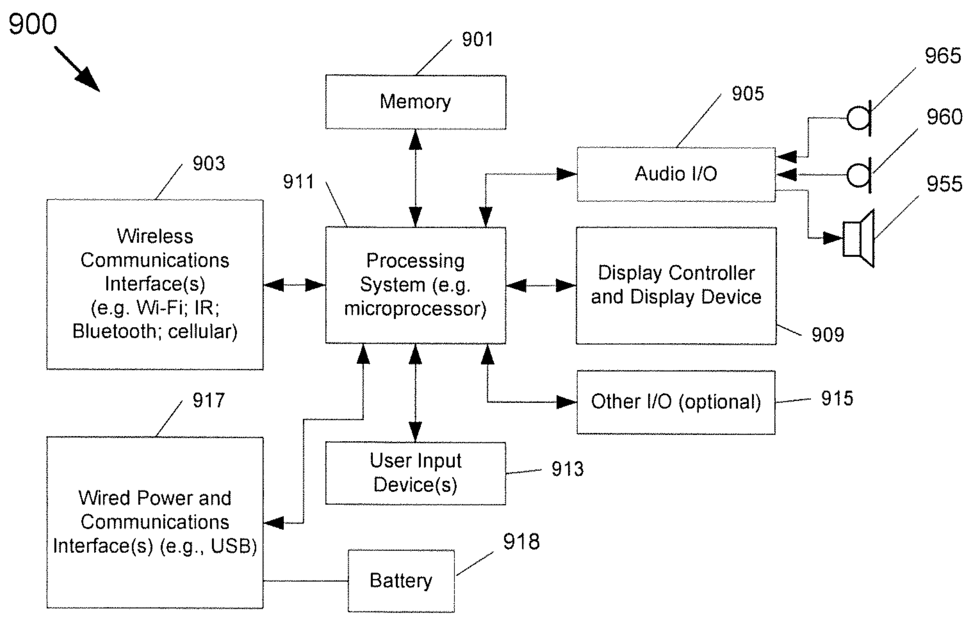
FIG. 9 illustrates one example of another data processing system, which may be used with one embodiment of the invention.

FIG. 9 shows an example of a data processing system 900 which may be used with one embodiment of the invention. Specifically, this figure shows a data processing system 900. The data processing system 900 shown in FIG. 9 includes a processing system 911, which may be one or more microprocessors or a system on a chip integrated circuit. The data processing system 900 also includes memory 901 for storing data and programs for execution by the processing system 911. The data processing system 900 also includes an audio input/output subsystem 905, which may include a primary microphone 965, a secondary microphone 960, and a speaker 955, for example, for playing back music or providing telephone functionality through the speaker and microphones.

A display controller and display device 909 provide a digital visual user interface for the user; this digital interface may include a graphical user interface similar to that shown on a Macintosh computer when running the OS X operating system software, or an Apple iPhone when running the iOS operating system, etc. The system 900 also includes one or more wireless communications interfaces 903 to communicate with another data processing system, such as the system 900 of FIG. 9. A wireless communications interface may be a WLAN transceiver, an infrared transceiver, a Bluetooth transceiver, and/or a cellular telephony transceiver. It will be appreciated that additional components, not shown, may also be part of the system 900 in certain embodiments, and in certain embodiments fewer components than shown in FIG. 9 may also be used in a data processing system. The system 900 further includes one or more wired power and communications interfaces 917 to communicate with another data processing system. The wired power and communications interface may be a USB port, etc. and may connect to a battery 918.

The data processing system 900 also includes one or more user input devices 913, which allow a user to provide input to the system. These input devices may be a keypad or keyboard, or a touch panel or multi touch panel. The data processing system 900 also includes an optional input/output device 915 which may be a connector for a dock. It will be appreciated that one or more buses, not shown, may be used to interconnect the various components as is well known in the art. The data processing system shown in FIG. 9 may be a handheld device or a personal digital assistant (PDA), or a cellular telephone with PDA-like functionality, or a handheld device which includes a cellular telephone, or a media player such as an iPod, or a device which combines aspects or functions of these devices such as a media player combined with a PDA and a cellular telephone in one device or an embedded device or other consumer electronic devices. In other embodiments, the data processing system 900 may be a network computer or an embedded processing device within another device or other type of data processing systems, which have fewer components or perhaps more components than that shown in FIG. 9.

At least certain embodiments of the inventions may be part of a digital media player, such as a portable music and/or video media player, which may include a media processing system to present the media, a storage device to store the media and may further include a radio frequency (RF) transceiver (e.g., an RF transceiver for a cellular telephone) coupled with an antenna system and the media processing system. In certain embodiments, media stored on a remote storage device may be transmitted to the media player through the RF transceiver. The media may be, for example, one or more of music or other audio, still pictures, or motion pictures.

The portable media player may include a media selection device, such as a click wheel input device on an iPod® or iPod Nano® media player from Apple, Inc. of Cupertino, Calif., a touch screen input device, pushbutton device, movable pointing input device or other input device. The media selection device may be used to select the media stored on the storage device and/or the remote storage device. The portable media player may, in at least certain embodiments, include a display device which is coupled to the media processing system to display titles or other indicators of media being selected through the input device and being presented, either through a speaker or earphone(s), or on the display device, or on both display device and a speaker or earphone(s). Examples of a portable media player are described in U.S. Pat. No. 7,345,671 and U.S. Pat. No. 7,627,343, both of which are incorporated herein by reference.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose device selectively activated or reconfigured by a computer program stored in the device. Such a computer program may be stored in a computer readable storage medium, such as, but not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a device bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The digital signal processing operations described above, such as audio compression, can all be done either entirely by a programmed processor, or portions of them can be separated out and be performed by dedicated hardwired logic circuits.

The foregoing discussion merely describes some exemplary embodiments of the invention. One skilled in the art will readily recognize from such discussion, from the accompanying drawings, and from the claims that various modifications can be made without departing from the spirit and scope of the invention.

What is claimed is:

1. An audio processor comprising:

a band splitter that is to split an input audio signal into a plurality of band signals;

for each band signal, a volume re-mapper to translate a user preference volume level to a converted volume level based on a programmable volume curve for the band signal, wherein each band signal is associated with one of a plurality of programmable volume curves, wherein each of the plurality of programmable volume curves is created by linearly interpolating between a minimum gain, a number of programmable points, and a maximum gain, wherein each of the programmable points represents a mapping from a user preference volume level to a converted volume level;

for each band signal, a gain stage that is to apply a signal gain to the band signal based on the converted volume level to generate a gain adjusted band signal;

for each band signal, a compressor that is to compress the gain adjusted band signal to generate one of a plurality of compressed band signals; and a band combiner that is to combine the plurality of compressed band signals into a combined audio signal.

2. The audio processor of claim 1 further comprising a limiter that is to limit the combined audio signal.

3. The audio processor of claim 2 further comprising a feedback loop from the limiter to each compressor.

4. The audio processor of claim 3, wherein the feedback loop sends status of the limiter to the compressors to prevent over-boost at the compressors.

5. The audio processor of claim 2 further comprising a feedback loop from the limiter to each gain stage.

6. The audio processor of claim 5, wherein the feedback loop sends status of the limiter to the gain stages to prevent over-boost at the gain stages.

7. The audio processor of claim 2, wherein the limiter receives a speaker protection signal from a speaker connected to the limiter and reacts according to the received speaker protection signal.

8. The audio processor of claim 7, wherein the speaker protection signal comprises one or more of current, voltage, or thermal temperature measured at the speaker.

9. The audio processor of claim 1 further comprising a latency configuration module that is to determine an internal block size so that a block size of the input audio signal is an integer multiple of the internal block size.

10. The audio processor of claim 9, wherein the latency configuration module is further to divide a block of the input audio signal into a plurality of internal blocks based on the internal block size.

11. The audio processor of claim 1, wherein the compressor is an RMS compressor.

12. The audio processor of claim 11, wherein RMS compressors for different band signals have different RMS window sizes.

13. The audio processor of claim 1, wherein the user preference volume level is within the range of 0.0-1.0, wherein the converted volume level is a dB value.

14. A method of audio processing comprising:

dividing an input audio signal into a plurality of band signals;

for each band signal, translating a user preference volume level to a converted volume level based on a programmable volume curve for the band signal, wherein each band signal is associated with one of a plurality of programmable volume curves, wherein each of the plurality of programmable volume curves is created by linearly interpolating between a minimum gain, a number of programmable points, and a maximum gain, wherein each of the programmable points represents a mapping from a user preference volume level to a converted volume level;

for each band signal, applying a signal gain to the band signal based on the converted volume level to generate a gain adjusted band signal; and for each band signal, compressing the gain adjusted band signal to generate one of a plurality of compressed band signals.

15. The method of claim 14 further comprising combining the plurality of compressed band signals into a combined audio signal.

16. The method of claim 15 further comprising limiting the combined audio signal.

17. The method of claim 16 further comprising sending a control signal from a module that limits the combined audio signal to a module that applies the signal gain in order to prevent over-boost.

18. The method of claim 16 further comprising sending a control signal from a module that limits the combined audio signal to a module that compresses the band signal in order to prevent over-boost.

19. The method of claim 14 further comprising determining an internal block size so that a block size of the input audio signal is an integer multiple of the internal block size.

20. The method of claim 19 further comprising dividing a block of the input audio signal into a plurality of internal blocks based on the internal block size.

21. The method of claim 14 further comprising determining a minimum latency based on an internal block size and a block size of the input audio signal.

22. The method of claim 21 to further comprising inserting the minimum latency into each block of the input audio signal.

* * * * *